United States Patent
Hebeisen (10) Patent No.: US 11,821,261 B2
(45) Date of Patent: Nov. 21, 2023

(54) WINDOW SHADE KEYPAD FUNCTIONALITY

(71) Applicant: Mechoshade Systems, LLC, Middleton, WI (US)

(72) Inventor: Stephen P. Hebeisen, Amawalk, NY (US)

(73) Assignee: MECHOSHADE SYSTEMS, LLC, Middleton, WI (US)

( * ) Notice: Subject to any disclaimer, the term of this patent is extended or adjusted under 35 U.S.C. 154(b) by 12 days.

(21) Appl. No.: 17/191,043

(22) Filed: Mar. 3, 2021

(65) Prior Publication Data

US 2021/0277716 A1   Sep. 9, 2021

Related U.S. Application Data

(60) Provisional application No. 62/984,841, filed on Mar. 4, 2020.

(51) Int. Cl.

| | | |
|---|---|---|
| *G06F 3/04847* | (2022.01) | |
| *E06B 9/68* | (2006.01) | |
| *E06B 9/74* | (2006.01) | |
| *G06F 3/04886* | (2022.01) | |
| *G06F 3/04812* | (2022.01) | |
| *G06F 3/01* | (2006.01) | |
| *G06F 3/0489* | (2022.01) | |

(52) U.S. Cl.
CPC ............... *E06B 9/74* (2013.01); *G06F 3/016* (2013.01); *G06F 3/04812* (2013.01); *G06F 3/04847* (2013.01); *G06F 3/04886* (2013.01); *G06F 3/04897* (2013.01); *E06B 2009/6809* (2013.01)

(58) Field of Classification Search
CPC .... E06B 9/74; E06B 9/322; E06B 2009/6809; E06B 2009/6818; G06F 3/016; G06F 3/04812; G06F 3/04847; G06F 3/04886; G06F 3/04897
See application file for complete search history.

(56) References Cited

U.S. PATENT DOCUMENTS 3,600,528 A * 8/1971 Leposavic .............. H01H 13/80
                                                                200/513
6,140,987 A * 10/2000 Stein ...................... H01H 13/70
                                                                345/87
7,941,245 B1 * 5/2011 Popat ........................ E06B 9/68
                                                                340/545.8

(Continued)

*Primary Examiner* — David S Posigian
(74) *Attorney, Agent, or Firm* — SNELL & WILMER L.L.P.

(57) ABSTRACT

The disclosure includes various keypad features, buttons, labels, shapes, sizes, format and materials. The system may comprise a processor; a keypad in communication with the processor and configured for controlling a window shade; capacitive or physical buttons on the keypad, wherein one of the capacitive buttons may be configured to set the window shade to a preset position; a proximity sensor; and a communication card. The processor may determine an override pattern to return the window shade to an automatic mode after a period of time from an override request. The capacitive buttons may include haptic feedback or visual feedback. The system may also include a scheduler and/or receive weather conditions. The system may also include an ambient light sensor.

15 Claims, 1 Drawing Sheet

(56) References Cited

U.S. PATENT DOCUMENTS

| | | | | |
|---|---|---|---|---|
| 2006/0185799 A1* | 8/2006 | Kates | .................. | E06B 9/32 |
| | | | | 160/5 |
| 2007/0213090 A1* | 9/2007 | Holmberg | ........... | G06F 3/04886 |
| | | | | 455/550.1 |
| 2010/0018654 A1* | 1/2010 | Skinner | .................... | E06B 9/72 |
| | | | | 160/84.02 |
| 2010/0286937 A1* | 11/2010 | Hedley | ................. | G06Q 50/06 |
| | | | | 702/60 |
| 2011/0240232 A1* | 10/2011 | Kluck | ..................... | E05F 15/79 |
| | | | | 160/5 |
| 2012/0031571 A1* | 2/2012 | Mullet | ..................... | E06B 9/40 |
| | | | | 160/310 |
| 2012/0203379 A1* | 8/2012 | Sloo | .................. | G05D 23/1902 |
| | | | | 700/276 |
| 2013/0102852 A1* | 4/2013 | Kozloski | ................. | F24F 11/30 |
| | | | | 600/300 |
| 2013/0103622 A1* | 4/2013 | Matsuoka | ........... | H04L 12/2803 |
| | | | | 706/12 |
| 2014/0207693 A1* | 7/2014 | Horst | .................... | G06Q 50/16 |
| | | | | 705/317 |
| 2016/0127530 A1* | 5/2016 | Mullet | .................... | H04W 4/50 |
| | | | | 455/557 |
| 2016/0237745 A1* | 8/2016 | Wen | ..................... | G01J 1/4204 |
| 2016/0258209 A1* | 9/2016 | Berman | ................... | E06B 9/32 |
| 2017/0070842 A1* | 3/2017 | Kulp | ................... | H04L 67/325 |
| 2017/0212488 A1* | 7/2017 | Kummer | ............. | G05B 19/042 |
| 2017/0276542 A1* | 9/2017 | Klawuhn | ................. | E06B 9/24 |
| 2018/0252035 A1* | 9/2018 | Casey | .................. | G05B 11/32 |
| 2019/0071926 A1* | 3/2019 | Hall | ....................... | E06B 9/322 |

* cited by examiner

WINDOW SHADE KEYPAD FUNCTIONALITY

CROSS-REFERENCE TO RELATED APPLICATIONS

This disclosure claims priority to, and the benefit of, U.S. Ser. No. 62/984,841 filed on Mar. 4, 2020 and entitled "Window Shade Keypad Functionality," which is hereby incorporated by reference in its entirety for all purposes.

FIELD

The disclosure relates to keypads, and more particularly, to smart keypads that operate window shade systems, lighting systems, air conditioning systems and/or other building systems.

BACKGROUND

Consumers desire keypads that provide advanced functionality, aesthetics, intuitiveness, customization and learning. Aesthetics relates to the appealing visual and tactile nature of the keypad. Intuitiveness relates to the ease with which a user can operate the keypad, regardless of prior training. Customization relates to the ability for a user to dictate features or functions to the user's particular liking. Learning relates to the ability to acquire additional knowledge based on inputs and changes to a routine.

SUMMARY

The disclosure includes various keypad features, buttons, labels, shapes, sizes, formats and materials. The system may comprise a processor; a keypad in communication with the processor and configured for controlling a single or group of window coverings (e.g., window shades); capacitive or physical buttons on the keypad, wherein one of the capacitive buttons is configured to set the window shade to a preset position; a proximity sensor configured for detecting the location of someone close to the keypad; and a communication card configured to support communication via RF to a local WIFI or Bluetooth LAN to support configuration and/or control. The system may also include an optional communication card or circuit which may route communication messages to a network inside the building connected to other window coverings.

The system may comprise a learning button configured to instruct the processor to acquire data about conditions associated with an override request, wherein the override request overrides an automation routine, and wherein the processor adjusts the automation routine based on the conditions associated with the override request.

The processor may be further configured to adjust the automation routine back to a pre-existing automation routine, in response to the override request violating an eco-friendly result. The processor may be further configured to acquire information about the user associated with the override request. The processor may be further configured to transmit queries to obtain more information from the user about the override request. The processor may be further configured to track time and conditions associated with the override request. The keypad includes a light or backlight of a first color, in response to the system being in automation mode.

The processor may be configured to return a window covering position override back to automatic mode after a specified delay time, at a specific time of the day. The processor may be configured to determine an override pattern to return the window shade to an automatic mode after a period of time from an override request. The capacitive buttons may include haptic feedback or visual feedback by at least one of changing backlight levels or flashing the backlight. The keypad may interface with at least one of a POE network, an internet or a private network. The system may also include a scheduler and/or receive weather conditions. The system may also include an ambient light sensor configured to adjust backlighting levels based on ambient light levels.

BRIEF DESCRIPTION OF THE DRAWINGS

The subject matter of the present disclosure is particularly pointed out and distinctly claimed in the concluding portion of the specification. However, a more complete understanding of the present disclosure may best be obtained by referring to the detailed description and claims when considered in connection with the drawing FIGURE, wherein like reference numbers relate to like elements.

DETAILED DESCRIPTION

Figure 1:
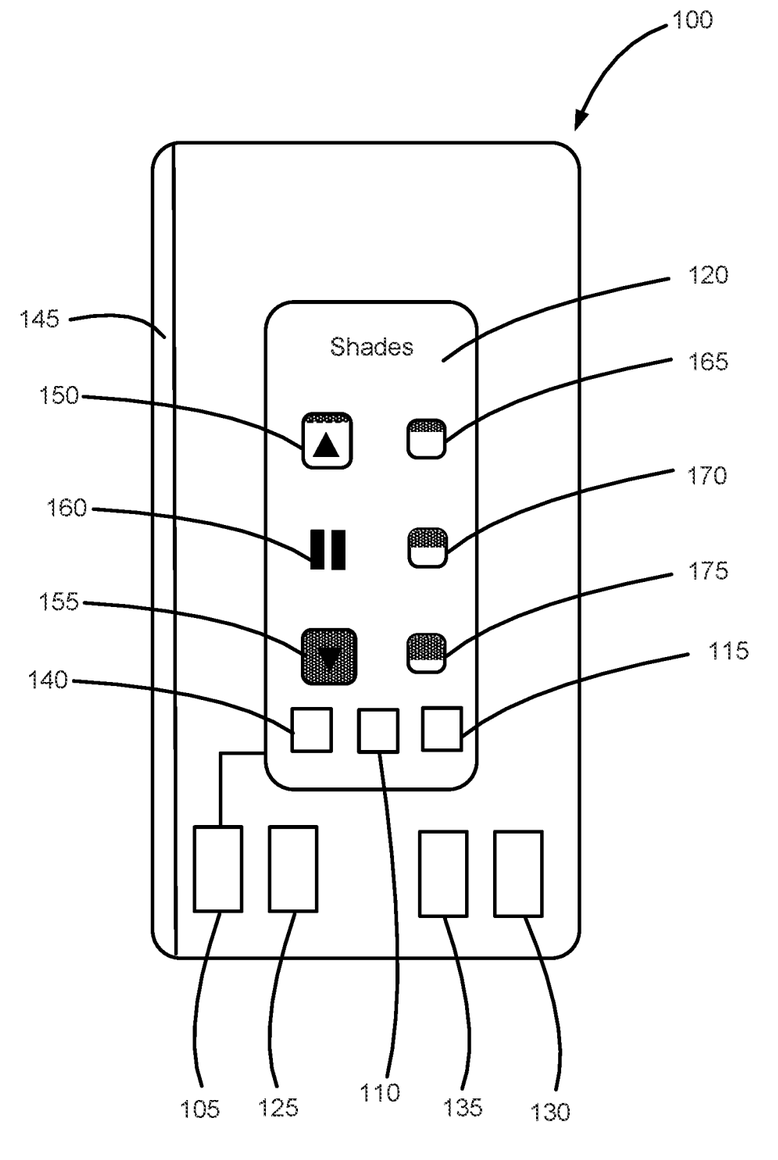
FIG. 1 is an exemplary keypad configured to activate various functions, in accordance with various embodiments.

In various embodiments, the system 100 may include one or more of processors 105, capacitive screen with capacitive buttons, physical buttons (e.g., with spring components), one or more ambient light sensors 130, one or more proximity sensors 135, one or more actuating buttons, motion to wake (deadfront), one or more LEDs (e.g., front lit, back lit, behind the screen, color changing, etc.), one or more logos, one or more backlit logos, one or more audible sounds, one or more vibrations and/or similar features. Processor 105 may be configured to communicate with any of the components set forth herein. Processor 105 may be configured to control any of the components and/or functions set forth herein. The FIGURES show different exemplary designs of the keypad, in accordance with various embodiments. The various features, buttons, labels shapes, sizes, format, materials, etc. may be interchanged among the various FIGURES to create additional embodiments. An internal proximity sensor 135 may be configured for detecting the location of someone close to the keypad. Proximity sensor 135 may be configured to enable a feature (e.g., backlighting 120 the switch) based on user proximity to the keypad. In various embodiments, the surface or sides of the buttons may be flush, scalloped or angled in any way. The buttons may be separated by raised dividers, flush dividers or have no dividers between the buttons. The buttons may include tactile and/or capacitive buttons. For the capacitive solution, in various embodiments, the system 100 may incorporate the use of haptic feedback. For example, the system 100 may incorporate the use of a vibration, audible sound (potentially configurable), shaking the window shades, jogging the window shades up and/or down, and/or any other device or method could be used to give feedback that an action has been selected. Moreover, visible feedback may be used to provide feedback that an action has been selected such as, for example, changing backlight 120 levels or flashing the backlight 120. Button lights may light when activated, and button lights may time out after a configurable timeframe. Light levels may be configured based on, for example, time of day, sunrise/sunset timing and/or a configurable offset.

In various embodiments, one or more buttons may interface with a common, routed spring steel layer. Such a spring provides design flexibility because the button spring action does not need to hinge from the side of a frame. The common springs also allow button sets to be collected together for easy replacement in the field. Individual or groups of buttons may be configured to be replaced (e.g., for custom labeling purposes). An entire button set may be replaced in limited steps or a single step (e.g., after onsite programming is completed).

An action as disclosed herein may be a window shade movement, adjusting a motor, adjusting a light (e.g., brightness, color, etc.), adjusting speed of the window shade, adjusting acceleration of the window shade, adjusting air conditioning, instructing a building management system, etc. The system 100 may at times be described herein as adjusting window shades, but the system 100 contemplates similar functionality for adjusting any action.

In various embodiments, the user may provide more specific information to the system 100 by selecting certain buttons on the keypad, entering additional data into a computer terminal, entering data into a kiosk, using a voice recognition system, entering certain data into an app and/or the system 100 may obtain profile information about the user from a stored profile, the human resources system, the internet or from social media. For example, a subset or all of the physical buttons may be replicated on an app on a user's smartphone or may be replicated on a user's computer. The user, as used herein, may be an occupant, a supervisor, a building manager, a field technician, a dealer, an installer, a security person, a person operating the keypad functions remotely, a building management system, software and/or an app.

In various embodiments, the buttons (e.g., 150, 155) may be pressed and held to start an action and/or until an action stops. For example, a maintained button press may initiate shade movement when pressed and stops shade movement when released. In various embodiments, the keypad may support setting limits and/or customizing preset levels. For example, the keypad system 100 may include one-touch shade positioning (e.g., a preset location associated with a single button) or maintained button press operation of the up and down commands to any number of presets (e.g., 3 presets) up and down. The system 100 may include the use of a pause or stop button (e.g., 160) in order to pause or stop shade movement. Such pause or stop button may include a one-touch button (e.g., 160) to pause or stop a shade at an intermediate point in its travel.

Any of the buttons may be pressed and quickly released to activate a partial or full pre-set action. The action may be a sequence of actions and/or scenes. In various embodiments, any preset number of actions (e.g., shade positions) may be included and any number of buttons representing different actions or part of the actions may be included. Moreover, one button may be configured to activate different preset actions by, for example, depressing the button multiple times. Preset buttons may have icons that may represent a position or action. For example, each of the preset buttons may represent a window shade being 25% (e.g., 165), 50% (e.g., 170) or 75% (e.g., 175) open.

In various embodiments, a pre-set or setting limits mode may be entered by removing the wallplate (e.g., a pushbutton recognizes when a wallplate is installed or removed) and entering a specific button sequence as a code. At this point, the keypad may be in a configuration tool mode. The mode may be cancelled by entering another code sequence, attaching the wallplate and/or pressing the recessed button that the wallplate actuates. The limit setting, etc. can also be implemented through the Bluetooth connection using an app or by using a configuration software program running from a computing device attached to the building network.

In various embodiments, the keypad may control one zone or multiple zones with various combinations of move, pause, auto, preset, mode setting, blackout and/or other button commands. A zone may comprise a grouping of actions, a geographic area for the actions, a part of a building, a floor of a building, a subset of facilities and/or the like. In various embodiments, the "shade" label area can also be a selection for different zones of control. A single zone control may control the lights, the window shades, the air conditioning and/or other systems in a particular zone.

In various embodiments, a light bar 145 may be included to visually represent any action. For example, the lighted portion of the light bar 145 may visually represent the position of the shade. The length of the lighted portion of the light bar 145 may indicate the length that the window shade is unrolled and over the window. The light bar 145 may be helpful to understand the positioning of the window shade, particularly when the user is not able to see the window shade or the movements of the window shade. The speed of the movement of the light bar 145 may be similar to the speed of movement of the window shade. The light bar 145 may track movement of a selected window shade or groups of window shades. The light color may be white and may be represented in various LEDs based on, for example, the specific location or other details of shade position feedback desired. The light bar may change to a different color or flash in order to represent status, mode, an error condition or other user feedback associated with the button command.

In various embodiments, the keypad may include an automation button 110. The user may select the automation button 110 in order to toggle the operating mode of the system 100 into or out of automation mode. The keypad or certain parts of the keypad may change color based on the automation mode being active or inactive. The automation mode may allow the system 100 to control any action based on pre-set data and/or acquired data. For example, the system 100 may control the operation of window shades based on time of day, sensors, environmental data, tracking data, etc. In various embodiments, one or more buttons may implement an ecologically friendly (e.g., eco-friendly) operating mode for the window shades (and/or other building systems). The mode may be eco-friendly because the mode positions the shades to help the building save on energy consumption and/or carbon footprint by reducing window shade energy consumption and./or energy consumption of other building systems (e.g., lighting system, air conditioning systems, etc). The system 100 may move the window shades up at sunset and down at sunrise, or optimally adjust the window shades based on the solar angle for comfort or energy-related optimization. The system 100 may move a subset of the shades down on the East side of the building to avoid the hot and glaring sunlight at sunrise. The system 100 may also be proactive by optimally adjusting the window shades before the sun starts to rise and/or adjusting the window shades before the sun starts to set. The system 100 may also be eco-friendly because the system 100 may be programmed with algorithms that restrict light pollution to obtain additional LEED credits.

For additional information related to such automated features, see the features and functions in, for example, U.S. Ser. No. 14/692,868 which is a continuation of PCT Application No. PCT/US2013/066316 filed on Oct. 23, 2013 and entitled "Automated Shade Control System Utilizing Brightness Modeling". PCT Application No. PCT/US2013/066316 is a continuation of U.S. Ser. No. 13/671,018 filed on Nov. 7, 2012, now U.S. Pat. No. 8,890,456 entitled "Automated Shade Control System Utilizing Brightness Modeling". U.S. Ser. No. 13/671,018 is a continuation-in-part of U.S. Ser. No. 13/556,388 filed on Jul. 24, 2012, now U.S. Pat. No. 8,432,117 entitled "Automated Shade Control System". U.S. Ser. No. 13/556,388 is a continuation of U.S. Ser. No. 13/343,912 filed on Jan. 5, 2012, now U.S. Pat. No. 8,248,014 entitled "Automated Shade Control System". U.S. Ser. No. 14/692,868 is also a continuation-in-part of U.S. Ser. No. 14/461,619 filed on Aug. 18, 2014, now U.S. Pat. No. 9,360,731 entitled "Systems and Methods for Automated Control of Electrochromic Glass." U.S. Ser. No. 14/461,619 is a continuation of U.S. Ser. No. 13/656,401 filed on Oct. 19, 2012, now U.S. Pat. No. 8,836,263 entitled "Automated Shade Control in Connection With Electrochromic Glass". U.S. Ser. No. 13/656,401 is a continuation-in-part of U.S. Ser. No. 13/359,575 filed on Jan. 27, 2012, now U.S. Pat. No. 8,723,467 entitled "Automated Shade Control in Connection with Electrochromic Glass." U.S. Ser. No. 13/359,575 is a continuation-in-part of U.S. Ser. No. 13/343,912 filed on Jan. 5, 2012, now U.S. Pat. No. 8,248,014 entitled "Automated Shade Control System". U.S. Ser. No. 13/343,912 is a continuation of U.S. Ser. No. 12/475,312 filed on May 29, 2009, now U.S. Pat. No. 8,120,292 entitled "Automated Shade Control Reflectance Module". U.S. Ser. No. 12/475,312 is a continuation-in-part of U.S. Ser. No. 12/421,410 filed on Apr. 9, 2009, now U.S. Pat. No. 8,125,172 entitled "Automated Shade Control Method and System". U.S. Ser. No. 12/421,410 is a continuation-in-part of U.S. Ser. No. 12/197,863 filed on Aug. 25, 2008, now U.S. Pat. No. 7,977,904 entitled "Automated Shade Control Method and System." U.S. Ser. No. 12/197,863 is a continuation-in-part of U.S. Ser. No. 11/162,377 filed on Sep. 8, 2005, now U.S. Pat. No. 7,417,397 entitled "Automated Shade Control Method and System." U.S. Ser. No. 11/162,377 is a continuation-in-part of U.S. Ser. No. 10/906,817 filed on Mar. 8, 2005, and entitled "Automated Shade Control Method and System." U.S. Ser. No. 10/906,817 is a non-provisional of U.S. Provisional No. 60/521,497 filed on May 6, 2004, and entitled "Automated Shade Control Method and System." The entire contents of all of the foregoing patents and applications are hereby incorporated by reference for all purposes.

The automation may also be based on a sky camera system that may incorporate any of the feature or functions set forth in U.S. Ser. No. 16/849,834, which is hereby incorporated by reference in its entirety for all purposes. The '834 application is a continuation-in-part of U.S. Ser. No. 16/240,479 filed on Jan. 4, 2019 and entitled "Sky Camera System Utilizing Circadian Information For Intelligent Building Control." U.S. Ser. No. 16/240,479 is a continuation-in-part of U.S. Ser. No. 15/906,674 filed on Feb. 27, 2018 and entitled "Sky Camera System for Intelligent Building Control". U.S. Ser. No. 15/906,674 is a non-provisional of, and claims priority to, U.S. Provisional Patent Application Ser. No. 62/513,733 filed on Jun. 1, 2017 and entitled "Sky Camera System for Intelligent Building Control." U.S. Ser. No. 15/906,674 is also a continuation-in-part of U.S. Ser. No. 14/692,868 filed on Apr. 22, 2015, now U.S. Pat. No. 9,938,765 entitled "Automated Shade Control System Interaction with Building Management System." The entire contents of all of the foregoing patents and applications are hereby incorporated by reference for all purposes.

In various embodiments, the keypad may include functions that enable learning activities and the button may be multiplexed. For example, the keypad may include a learning button 115 (e.g., IQ button). When a user overrides an action (e.g., a window shade movement), the user could stipulate that the user wants the system 100 to learn from this override. Thus, the system 100 may include a button (e.g., IQ button 115) that is selected after or before the user overrides the window shade. In various embodiments, the system 100 may include the IQ button 115 features when the override button 140 is selected, such that a separate IQ button 115 may not be needed. To override a particular automation routine, the user may select an override button 140. The user may hold an automation button 110, while the user selects an override command. When a shade is overridden from its current position, the shade may be taken out of automatic mode, so that the pre-established movement from schedulers or sensors will not change the shade position. Motors can be configured to return back to automatic mode a configurable time later, at a configurable time of the day, at a configurable event of the day (sunrise, noon, sunset, night, etc. along with an offset time), based on occupancy or vacancy. Moreover, motors can be configured to return back to automatic mode based on the user commanding it back to automatic mode through the keypad. The backlight 120 for the automatic mode icon may be color configurable (e.g., red, green or blue) to indicate when the automation mode is activated and de-activated. Based on the user preferences over time learned from the user selecting the IQ button 115, the system 100 may determine (e.g., using artificial intelligence routines) that certain algorithms or adjustments to actions should be implemented. For example, if the user selects an override to stop the window shades from being lowered because the user prefers natural light, the system 100 may determine that, based on user preferences, the system 100 may select the optimization of daylighting instead of using the artificial light (that would have resulted from automation).

As another example, an automation mode may cause the lights to activate and the window shades to rise at 6 pm. However, if a user is planning a powerpoint presentation in a conference room at 6 pm, the user may not want the lights to activate and the user may want the window shades to remain lowered during the presentation. As such, the user may toggle the automation mode button to adjust the system 100 out of automation mode. After the presentation is over, the user may select the automation mode button again to return the system 100 to automation.

In addition, in various communication networks, it may be possible for various systems to interact or integrate such that another building subsystem may be capable of overriding the shade settings and/or the automation mode status. For example, a video conference camera system may have a scheduled presentation and wish to manage the room condition through shade settings during the presentation to optimize the video experience. The system 100 may determine if an override request is appropriate and/or if the override request may impact an eco-friendly result. The system 100 may also be capable of being setup to ensure that an eco-friendly mode supports a specific energy code such as ASHRAE 90.1 or California Title 24. In response to a user selecting an override or IQ button 115, the system 100 may reject the override request and/or not consider the override request for adjusting an algorithm based on an IQ request. Any portion of the keypad may provide an indication to the user that the override was rejected (e.g., the override button 140 turns red). For example, a user may select an override that restricts window shades from being lowered by an automation routine. However, maintaining the windows in the open position causes a large amount of solar radiant heat gain to enter a large room with a lot of other people. Moreover, allowing the large amount of heat gain to enter a large room causes the system 100 to activate the air conditioning system in the middle of the day at the higher electric rates. In such a situation, the system 100 may monitor such changes and determine that such changes are not eco-friendly due to the increased electricity usage. As a result, the system 100 may reject the override request and return the system 100 to the automation mode to avoid further increasing the electricity usage. The system 100 may predict that such changes would cause the need for increased electricity usage. As a result, the system 100 may reject the override request before any increase in electricity usage was needed.

The system 100 may acquire more specific information about the override request. In various embodiments, as mentioned above, the user may provide more specific information related to the override by selecting certain buttons on the keypad, entering additional data into a computer terminal, entering certain data into an app and/or the system 100 may obtain profile information about the user from a stored profile or from social media. Furthermore, the IQ button 115 may activate a process for sending some queries to the user to obtain more specific information about the override request. For example, the system 100 may send a query asking the user why a group of window shades should be overridden such that that subset of window shades remains open. In this way, the system 100 may learn that the user prefers more natural light and the system 100 may store any additional information about the override that the user may have entered such as changing a comfort threshold on glare sensors connected to the network in that room or space, or changing a solar penetration or solar angle setting in automation controller logic.

Moreover, the system 100 may track the time and conditions associated with the override selection such that the system 100 can further learn about when the user prefers such override functions. For example, the system 100 may record that the user selected an override at 3 pm to maintain certain window shades in an open position (to override the automation that instructed the window shade system to lower the window shades at 3 pm). The system 100 may also record that at 3 pm the weather included a large downpour of rain. Thus, the system 100 may conclude that the user prefers the window shades open while it is raining outside, so the user can enjoy seeing the rain. The system 100 may then adjust its algorithm or implement a new algorithm that leaves certain window shades open (near this particular user) during rainy weather.

In various embodiments, the keypad may attach to a power over ethernet (POE) network and/or any other network to control the window shades. They system 100 may include configurable nodes on the network for various devices and control points. Any communication card 125 may be included that is configured to provide, for example, an RF option that may include 2-way communication. For example, the communication card 125 may also be configured to include an internal Bluetooth and/or RF communication capability with integral antenna. The communication card 125 may support communication via RF to a local WIFI or Bluetooth LAN to support configuration and/or control. The system may include an optional communication card or circuit which may route communication messages to a network inside the building connected to other window coverings. The Bluetooth may communicate with a window shade control gateway or gateways to other systems that perform other actions. Such communication may facilitate, for example, dealer or facility manager connection to the keypad for configuration of the keypad. The connection may be used by field technicians, dealers, facility managers and/or possibly occupants to configure, troubleshoot and/or control the keypad and/or other devices on the building's window covering communication network. The system 100 supports methods for pairing to smart phones, for example, when the keypad is in configuration tool mode. The system 100 supports methods for supporting Bluetooth beacon tracking for asset or people tracking through their smartphones or devices. This data could be used to help identify operational preferences in the room or space and adjust the settings of window coverings to match preferences. It also may feed this information into a larger building system need for Bluetooth tracking which may support needs such as tracking people density to anticipate health risk (e.g. COVID-19 spread reduction tactics). The keypad can support and store a configurable number of smart phone users. Indication of pairing status may be seen through, for example, a mode LED that may be located on the keypad or elsewhere. The dealer may use an app to configure the keypad. The configuration of the keypad may include establishing or adjusting various settings such as, for example, how each button operates (e.g., one touch, hold and release, multiple touch, etc.), what each button controls (e.g., lights, window shades, air conditioning, etc.), zones controlled by certain buttons, the colors of the lights, when the lights are activated, setting sensitivity levels for the proximity sensor, parameters for allowing or rejecting an override, etc.

In various embodiments, such communication may also facilitate, for example, dealer or facility manager connection to the keypad for configuration of an internal proximity sensor which detects the presence of a person within a configurable distance. The system 100 then may power the backlighting 120 to a configurable level which may be different than that which identifies activation, so that the person coming up to the keypad knows what the keypad controls and the control options for the keypad. Such communication may also facilitate, for example, dealer or facility manager connection to the network (POE, proprietary network, etc.) to configure, troubleshoot or control any device on the network. Such communication may also facilitate, for example, occupant connection to the keypad and/or network to control devices on the network. Such communication may also facilitate, for example, an ambient light sensor 130 configured with the keypad in order to adjust the backlighting 120 level based on room light level. The backlighting 120 may also be adjusted based on light levels read by devices on the network and/or based on occupancy levels detected by devices on the network.

In various embodiments, the app may support the dealer certification program which may allow features within the app to be available for the dealer's installer based on the company's certification level and/or the installer's certification level. For example, certain less experienced installers may have a lower certification level that limits the installer from adjusting certain feature settings on the keypad and/or any device on the building's window covering communication network. The communication may also facilitate, for example, dealer or facility manager connection to the keypad for configuration of an internal astronomical scheduler feature in the keypad.

In various embodiments, the keypad system 100 may include an internal astronomic scheduler for scheduling the automated operation of the actions on the network. In addition, the system 100 may be configured for scheduling the backlighting 120 levels of the keypad. The keypad may be setup to support a multiple day (e.g., 7-day) scheduler capability. The keypad scheduler may support scheduling window shade actions anywhere on the network (regardless if the window shade is controlled by the keypad). The scheduler may move and/or change modes of operation based on, for example, time of day or sunrise/sunset plus a configurable offset time. For example, a user may prefer a configurable offset time such that the window shades are down before the sun starts to rise. The scheduling features, how many actions may be scheduled and/or zones of operation may depend on the available memory. The scheduled actions may be based on weather conditions, so the system 100 may interface with weather conditions through access to sensor information on the network or the system 100 may acquire data from internet weather sources. Weather conditions may include, for example, clear/cloudy/rainy day, external temperature information, etc. The scheduler (or any other functions discussed herein) may be programmed from the keypad, from an app, from a computer and/or using voice activation.

The keypad may also include operation as a smart switch. The smart switch offers a single lighting control point that determines the amount of light needed/desired at the task area or as part of ambient light, and determines the optimal way to support it through combinations of natural light and artificial light. The system 100 may determine (e.g., using artificial intelligence) the optimal way to adjust the artificial light (e.g., by sending a request to the lighting system), adjust the daylight (e.g., by sending a request to the shade system and/or adjust the motors controlling the window shades) to optimize the task area or to adjust the ambient light. The system 100 may take different actions based on inputs from sensors, from the environment and/or from in the room. Certain sensors may monitor the occupancy, exterior light at the window, interior room lighting, interior temperature, exterior temperature, weather, computer screen brightness, etc. at the task area. AI can also be used to help understand user preferences which learn based on user interaction with automation and overrides under various conditions. The inputs may indicate that the user is working at the desk, has the computer screen on, leaving a room, giving a presentation, having a social event with many people in the room, working at night, etc. The system 100 may create "scenes" by performing one or more actions that are typically needed for a certain activity. For example, if a user is about to provide a powerpoint presentation, the system 100 may activate a "presentation" scene by lowering the presentation screen, turning on the projector, lowering the brightness of the lights and lowering the window shades.

The detailed description of exemplary embodiments herein makes reference to the accompanying drawings, which show exemplary embodiments by way of illustration and its best mode, and not of limitation. While these exemplary embodiments are described in sufficient detail to enable those skilled in the art to practice the invention, it should be understood that other embodiments may be realized and that logical, chemical and mechanical changes may be made without departing from the spirit and scope of the invention. For example, the steps recited in any of the method or process descriptions may be executed in any order and are not necessarily limited to the order presented. Moreover, many of the functions or steps may be outsourced to or performed by one or more third parties. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Systems and methods are provided. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the invention. The scope of the invention is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

Any communication, transmission, and/or channel discussed herein may include any system or method for delivering content (e.g. data, information, metadata, etc.), and/or the content itself. The content may be presented in any form or medium, and in various embodiments, the content may be delivered electronically and/or capable of being presented electronically. For example, a channel may comprise a website, mobile application, or device (e.g., FACEBOOK®, YOUTUBE®, PANDORA®, APPLE TV®, MICROSOFT® XBOX®, ROKU®, AMAZON FIRE®, GOOGLE CHROMECAST™, SONY® PLAYSTATION®, NINTENDO® SWITCH®, etc.) a uniform resource locator ("URL"), a document (e.g., a MICROSOFT® Word or EXCEL, an ADOBE® Portable Document Format (PDF) document, etc.), an "ebook," an "emagazine," an application or microapplication (as described herein), an short message service (SMS) or other type of text message, an email, a FACEBOOK® message, a TWITTER® tweet, multimedia messaging services (MMS), and/or other type of communication technology. In various embodiments, a channel may be hosted or provided by a data partner. In various embodiments, the distribution channel may comprise at least one of a merchant website, a social media website, affiliate or partner websites, an external vendor, a mobile device communication, social media network, and/or location based service. Distribution channels may include at least one of a merchant website, a social media site, affiliate or partner websites, an external vendor, and a mobile device communication. Examples of social media sites include FACEBOOK®, FOURSQUARE®, TWITTER®, LINKEDIN®, INSTAGRAM®, PINTEREST®, TUMBLR®, REDDIT®, SNAPCHAT®, WHATSAPP®, FLICKR®, VK®, QZONE®, WECHAT®, and the like. Examples of affiliate or partner websites include AMERICAN EXPRESS®, GROUPON®, LIVINGSOCIAL®, and the like. Moreover, examples of mobile device communications include texting, email, and mobile applications for smartphones.

Computer programs (also referred to as computer control logic) are stored in main memory and/or secondary memory. Computer programs may also be received via communications interface. Such computer programs, when executed, enable the computer system to perform the features as discussed herein. In particular, the computer programs, when executed, enable the processor 105 to perform the features of various embodiments. Accordingly, such computer programs represent controllers of the computer system.

These computer program instructions may be loaded onto a general purpose computer, special purpose computer, or other programmable data processing apparatus to produce a machine, such that the instructions that execute on the computer or other programmable data processing apparatus create means for implementing the functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified in the flowchart block or blocks.

In various embodiments, software may be stored in a computer program product and loaded into a computer system using a removable storage drive, hard disk drive, or communications interface. The control logic (software), when executed by the processor 105, causes the processor 105 to perform the functions of various embodiments as described herein. In various embodiments, hardware components may take the form of application specific integrated circuits (ASICs). Implementation of the hardware so as to perform the functions described herein will be apparent to persons skilled in the relevant art(s).

As will be appreciated by one of ordinary skill in the art, the system may be embodied as a customization of an existing system, an add-on product, a processing apparatus executing upgraded software, a stand-alone system, a distributed system, a method, a data processing system, a device for data processing, and/or a computer program product. Accordingly, any portion of the system or a module may take the form of a processing apparatus executing code, an internet based embodiment, an entirely hardware embodiment, or an embodiment combining aspects of the internet, software, and hardware. Furthermore, the system may take the form of a computer program product on a computer-readable storage medium having computer-readable program code means embodied in the storage medium. Any suitable computer-readable storage medium may be utilized, including hard disks, CD-ROM, BLU-RAY DISC®, optical storage devices, magnetic storage devices, and/or the like.

In various embodiments, components, modules, and/or engines of system 100 may be implemented as micro-applications or micro-apps. Micro-apps are typically deployed in the context of a mobile operating system, including for example, a WINDOWS® mobile operating system, an ANDROID® operating system, an APPLE® iOS operating system, a BLACKBERRY® company's operating system, and the like. The micro-app may be configured to leverage the resources of the larger operating system and associated hardware via a set of predetermined rules which govern the operations of various operating systems and hardware resources. For example, where a micro-app desires to communicate with a device or network other than the mobile device or mobile operating system, the micro-app may leverage the communication protocol of the operating system and associated device hardware under the predetermined rules of the mobile operating system. Moreover, where the micro-app desires an input from a user, the micro-app may be configured to request a response from the operating system which monitors various hardware components and then communicates a detected input from the hardware to the micro-app.

The system and method may be described herein in terms of functional block components, screen shots, optional selections, and various processing steps. It should be appreciated that such functional blocks may be realized by any number of hardware and/or software components configured to perform the specified functions. For example, the system may employ various integrated circuit components, e.g., memory elements, processing elements, logic elements, look-up tables, and the like, which may carry out a variety of functions under the control of one or more microprocessors or other control devices. Similarly, the software elements of the system may be implemented with any programming or scripting language such as C, C++, C#, JAVA®, JAVASCRIPT®, JAVASCRIPT® Object Notation (JSON), VBScript, Macromedia COLD FUSION, COBOL, MICROSOFT® company's Active Server Pages, assembly, PERL®, PHP, awk, PYTHON®, Visual Basic, SQL Stored Procedures, PL/SQL, any UNIX® shell script, and extensible markup language (XML) with the various algorithms being implemented with any combination of data structures, objects, processes, routines or other programming elements. Further, it should be noted that the system may employ any number of conventional techniques for data transmission, signaling, data processing, network control, and the like. Still further, the system could be used to detect or prevent security issues with a client-side scripting language, such as JAVASCRIPT®, VBScript, or the like.

The system and method are described herein with reference to screen shots, block diagrams and flowchart illustrations of methods, apparatus, and computer program products according to various embodiments. It will be understood that each functional block of the block diagrams and the flowchart illustrations, and combinations of functional blocks in the block diagrams and flowchart illustrations, respectively, can be implemented by computer program instructions.

Accordingly, functional blocks of the block diagrams and flowchart illustrations support combinations of means for performing the specified functions, combinations of steps for performing the specified functions, and program instruction means for performing the specified functions. It will also be understood that each functional block of the block diagrams and flowchart illustrations, and combinations of functional blocks in the block diagrams and flowchart illustrations, can be implemented by either special purpose hardware-based computer systems which perform the specified functions or steps, or suitable combinations of special purpose hardware and computer instructions. Further, illustrations of the process flows and the descriptions thereof may make reference to user WINDOWS® applications, webpages, websites, web forms, prompts, etc. Practitioners will appreciate that the illustrated steps described herein may comprise, in any number of configurations, including the use of WINDOWS® applications, webpages, web forms, popup WINDOWS® applications, prompts, and the like. It should be further appreciated that the multiple steps as illustrated and described may be combined into single webpages and/or WINDOWS® applications but have been expanded for the sake of simplicity. In other cases, steps illustrated and described as single process steps may be separated into multiple webpages and/or WINDOWS® applications but have been combined for simplicity.

In various embodiments, the software elements of the system may also be implemented using a JAVASCRIPT® run-time environment configured to execute JAVASCRIPT® code outside of a web browser. For example, the software elements of the system may also be implemented using NODE.JS® components. NODE.JS® programs may implement several modules to handle various core functionalities. For example, a package management module, such as NPM®, may be implemented as an open source library to aid in organizing the installation and management of third-party NODE.JS® programs. NODE.JS® programs may also implement a process manager, such as, for example, Parallel Multithreaded Machine ("PM2"); a resource and performance monitoring tool, such as, for example, Node Application Metrics ("appmetrics"); a library module for building user interfaces, and/or any other suitable and/or desired module.

Middleware may include any hardware and/or software suitably configured to facilitate communications and/or process transactions between disparate computing systems. Middleware components are commercially available and known in the art. Middleware may be implemented through commercially available hardware and/or software, through custom hardware and/or software components, or through a combination thereof. Middleware may reside in a variety of configurations and may exist as a standalone system or may be a software component residing on the internet server. Middleware may be configured to process transactions between the various components of an application server and any number of internal or external systems for any of the purposes disclosed herein. WEBSPHERE® MQTM (formerly MQSeries) by IBM®, Inc. (Armonk, NY) is an example of a commercially available middleware product. An Enterprise Service Bus ("ESB") application is another example of middleware.

The computers discussed herein may provide a suitable website or other internet-based graphical user interface which is accessible by users. In one embodiment, MICROSOFT® company's Internet Information Services (IIS), Transaction Server (MTS) service, and an SQL SERVER® database, are used in conjunction with MICROSOFT® operating systems, WINDOWS NT® web server software, SQL SERVER® database, and MICROSOFT® Commerce Server. Additionally, components such as ACCESS® software, SQL SERVER® database, ORACLE® software, SYBASE® software, INFORMIX® software, MYSQL® software, INTERBASE® software, etc., may be used to provide an Active Data Object (ADO) compliant database management system. In one embodiment, the APACHE® web server is used in conjunction with a LINUX® operating system, a MYSQL® database, and PERL®, PHP, Ruby, and/or PYTHON® programming languages.

For the sake of brevity, conventional data networking, application development, and other functional aspects of the systems (and components of the individual operating components of the systems) may not be described in detail herein. Furthermore, the connecting lines shown in the various FIGURES contained herein are intended to represent exemplary functional relationships and/or physical couplings between the various elements. It should be noted that many alternative or additional functional relationships or physical connections may be present in a practical system.

In various embodiments, the system and various components may integrate with one or more smart digital assistant technologies. For example, exemplary smart digital assistant technologies may include the ALEXA® system developed by the AMAZON® company, the GOOGLE HOME® system developed by Alphabet, Inc., the HOMEPOD® system of the APPLE® company, and/or similar digital assistant technologies. The ALEXA® system, GOOGLE HOME® system, and HOMEPOD® system, may each provide cloud-based voice activation services that can assist with tasks, entertainment, general information, and more. All the ALEXA® devices, such as the AMAZON ECHO®, AMAZON ECHO DOT®, AMAZON TAP®, and AMAZON FIRE® TV, have access to the ALEXA® system. The ALEXA® system, GOOGLE HOME® system, and HOMEPOD® system may receive voice commands via its voice activation technology, activate other functions, control smart devices, and/or gather information. For example, the smart digital assistant technologies may be used to interact with music, emails, texts, phone calls, question answering, home improvement information, smart home communication/activation, games, shopping, making to-do lists, setting alarms, streaming podcasts, playing audiobooks, and providing weather, traffic, and other real time information, such as news. The ALEXA®, GOOGLE HOME®, and HOMEPOD® systems may also allow the user to access information about eligible transaction accounts linked to an online account across all digital assistant-enabled devices.

The various system components discussed herein may include one or more of the following: a host server or other computing systems including a processor for processing digital data; a memory coupled to the processor for storing digital data; an input digitizer coupled to the processor for inputting digital data; an application program stored in the memory and accessible by the processor for directing processing of digital data by the processor; a display device coupled to the processor and memory for displaying information derived from digital data processed by the processor; and a plurality of databases. Various databases used herein may include: client data; merchant data; financial institution data; and/or like data useful in the operation of the system.

As those skilled in the art will appreciate, user computer may include an operating system (e.g., WINDOWS®, UNIX®, LINUX®, SOLARIS®, MACOS®, etc.) as well as various conventional support software and drivers typically associated with computers.

The present system or any part(s) or function(s) thereof may be implemented using hardware, software, or a combination thereof and may be implemented in one or more computer systems or other processing systems. However, the manipulations performed by embodiments may be referred to in terms, such as matching or selecting, which are commonly associated with mental operations performed by a human operator. No such capability of a human operator is necessary, or desirable, in most cases, in any of the operations described herein. Rather, the operations may be machine operations or any of the operations may be conducted or enhanced by artificial intelligence (AI) or machine learning. AI may refer generally to the study of agents (e.g., machines, computer-based systems, etc.) that perceive the world around them, form plans, and make decisions to achieve their goals. Foundations of AI include mathematics, logic, philosophy, probability, linguistics, neuroscience, and decision theory. Many fields fall under the umbrella of AI, such as computer vision, robotics, machine learning, and natural language processing. Useful machines for performing the various embodiments include general purpose digital computers or similar devices.

In various embodiments, the embodiments are directed toward one or more computer systems capable of carrying out the functionalities described herein. The computer system includes one or more processors. The processor is connected to a communication infrastructure (e.g., a communications bus, cross-over bar, network, etc.). Various software embodiments are described in terms of this exemplary computer system. After reading this description, it will become apparent to a person skilled in the relevant art(s) how to implement various embodiments using other computer systems and/or architectures. The computer system can include a display interface that forwards graphics, text, and other data from the communication infrastructure (or from a frame buffer not shown) for display on a display unit.

The computer system also includes a main memory, such as random access memory (RAM), and may also include a secondary memory. The secondary memory may include, for example, a hard disk drive, a solid-state drive, and/or a removable storage drive. The removable storage drive reads from and/or writes to a removable storage unit in a well-known manner. As will be appreciated, the removable storage unit includes a computer usable storage medium having stored therein computer software and/or data.

In various embodiments, secondary memory may include other similar devices for allowing computer programs or other instructions to be loaded into a computer system. Such devices may include, for example, a removable storage unit and an interface. Examples of such may include a program cartridge and cartridge interface (such as that found in video game devices), a removable memory chip (such as an erasable programmable read only memory (EPROM), programmable read only memory (PROM)) and associated socket, or other removable storage units and interfaces, which allow software and data to be transferred from the removable storage unit to a computer system.

The terms "computer program medium," "computer usable medium," and "computer readable medium" are used to generally refer to media such as removable storage drive and a hard disk installed in hard disk drive. These computer program products provide software to a computer system.

The computer system may also include a communications interface. A communications interface allows software and data to be transferred between the computer system and external devices. Examples of such a communications interface may include a modem, a network interface (such as an Ethernet card), a communications port, etc. Software and data transferred via the communications interface are in the form of signals which may be electronic, electromagnetic, optical, or other signals capable of being received by communications interface. These signals are provided to communications interface via a communications path (e.g., channel). This channel carries signals and may be implemented using wire, cable, fiber optics, a telephone line, a cellular link, a radio frequency (RF) link, wireless and other communications channels.

As used herein an "identifier" may be any suitable identifier that uniquely identifies an item. For example, the identifier may be a globally unique identifier ("GUID"). The GUID may be an identifier created and/or implemented under the universally unique identifier standard. Moreover, the GUID may be stored as 128-bit value that can be displayed as 32 hexadecimal digits. The identifier may also include a major number, and a minor number. The major number and minor number may each be 16-bit integers.

In various embodiments, the server may include application servers (e.g., WEBSPHERE®, WEBLOGIC®, JBOSS®, POSTGRES PLUS ADVANCED SERVER®, etc.). In various embodiments, the server may include web servers (e.g., Apache, IIS, GOOGLE® Web Server, SUN JAVA® System Web Server, JAVA® Virtual Machine running on LINUX® or WINDOWS® operating systems).

A web client includes any device or software which communicates via any network, such as, for example any device or software discussed herein. The web client may include internet browsing software installed within a computing unit or system to conduct online transactions and/or communications. These computing units or systems may take the form of a computer or set of computers, although other types of computing units or systems may be used, including personal computers, laptops, notebooks, tablets, smart phones, cellular phones, personal digital assistants, servers, pooled servers, mainframe computers, distributed computing clusters, kiosks, terminals, point of sale (POS) devices or terminals, televisions, or any other device capable of receiving data over a network. The web client may include an operating system (e.g., WINDOWS®, WINDOWS MOBILE® operating systems, UNIX® operating system, LINUX® operating systems, APPLE® OS® operating systems, etc.) as well as various conventional support software and drivers typically associated with computers. The web-client may also run MICROSOFT® INTERNET EXPLORER® software, MOZILLA® FIREFOX® software, GOOGLE CHROME™ software, APPLE® SAFARI® software, or any other of the myriad software packages available for browsing the internet.

As those skilled in the art will appreciate, the web client may or may not be in direct contact with the server (e.g., application server, web server, etc., as discussed herein). For example, the web client may access the services of the server through another server and/or hardware component, which may have a direct or indirect connection to an internet server. For example, the web client may communicate with the server via a load balancer. In various embodiments, web client access is through a network or the internet through a commercially-available web-browser software package. In that regard, the web client may be in a home or business environment with access to the network or the internet. The web client may implement security protocols such as Secure Sockets Layer (SSL) and Transport Layer Security (TLS). A web client may implement several application layer protocols including HTTP, HTTPS, FTP, and SFTP.

The various system components may be independently, separately, or collectively suitably coupled to the network via data links which includes, for example, a connection to an Internet Service Provider (ISP) over the local loop as is typically used in connection with standard modem communication, cable modem, DISH NETWORK®, ISDN, Digital Subscriber Line (DSL), or various wireless communication methods. It is noted that the network may be implemented as other types of networks, such as an interactive television (ITV) network. Moreover, the system contemplates the use, sale, or distribution of any goods, services, or information over any network having similar functionality described herein.

The system contemplates uses in association with web services, utility computing, pervasive and individualized computing, security and identity solutions, autonomic computing, cloud computing, commodity computing, mobility and wireless solutions, open source, biometrics, grid computing, and/or mesh computing.

Any of the communications, inputs, storage, databases or displays discussed herein may be facilitated through a website having web pages. The term "web page" as it is used herein is not meant to limit the type of documents and applications that might be used to interact with the user. For example, a typical website might include, in addition to standard HTML documents, various forms, JAVA® applets, JAVASCRIPT® programs, active server pages (ASP), common gateway interface scripts (CGI), extensible markup language (XML), dynamic HTML, cascading style sheets (CSS), AJAX (Asynchronous JAVASCRIPT And XML) programs, helper applications, plug-ins, and the like. A server may include a web service that receives a request from a web server, the request including a URL and an IP address (192.168.1.1). The web server retrieves the appropriate web pages and sends the data or applications for the web pages to the IP address. Web services are applications that are capable of interacting with other applications over a communication means, such as the internet. Web services are typically based on standards or protocols such as XML, SOAP, AJAX, WSDL and UDDI. Web services methods are well known in the art, and are covered in many standard texts. For example, representational state transfer (REST), or RESTful, web services may provide one way of enabling interoperability between applications.

The computing unit of the web client may be further equipped with an internet browser connected to the internet or an intranet using standard dial-up, cable, DSL, or any other internet protocol known in the art. Transactions originating at a web client may pass through a firewall in order to prevent unauthorized access from users of other networks. Further, additional firewalls may be deployed between the varying components of CMS to further enhance security.

Encryption may be performed by way of any of the techniques now available in the art or which may become available—e.g., Twofish, RSA, El Gamal, Schorr signature, DSA, PGP, PM, GPG (GnuPG), HPE Format-Preserving Encryption (FPE), Voltage, Triple DES, Blowfish, AES, MD5, HMAC, IDEA, RC6, and symmetric and asymmetric cryptosystems. The systems and methods may also incorporate SHA series cryptographic methods, elliptic curve cryptography (e.g., ECC, ECDH, ECDSA, etc.), and/or other post-quantum cryptography algorithms under development.

The firewall may include any hardware and/or software suitably configured to protect CMS components and/or enterprise computing resources from users of other networks. Further, a firewall may be configured to limit or restrict access to various systems and components behind the firewall for web clients connecting through a web server. Firewall may reside in varying configurations including Stateful Inspection, Proxy based, access control lists, and Packet Filtering among others. Firewall may be integrated within a web server or any other CMS components or may further reside as a separate entity. A firewall may implement network address translation ("NAT") and/or network address port translation ("NAPT"). A firewall may accommodate various tunneling protocols to facilitate secure communications, such as those used in virtual private networking. A firewall may implement a demilitarized zone ("DMZ") to facilitate communications with a public network such as the internet. A firewall may be integrated as software within an internet server or any other application server components, reside within another computing device, or take the form of a standalone hardware component.

Any databases discussed herein may include relational, hierarchical, graphical, blockchain, object-oriented structure, and/or any other database configurations. Any database may also include a flat file structure wherein data may be stored in a single file in the form of rows and columns, with no structure for indexing and no structural relationships between records. For example, a flat file structure may include a delimited text file, a CSV (comma-separated values) file, and/or any other suitable flat file structure. Common database products that may be used to implement the databases include DB2 ® by IBM® (Armonk, NY), various database products available from ORACLE® Corporation (Redwood Shores, CA), MICROSOFT ACCESS® or MICROSOFT SQL SERVER® by MICROSOFT® Corporation (Redmond, Washington), MYSQL® by MySQL AB (Uppsala, Sweden), MONGODB®, Redis, Apache Cassandra®, HBASE® by APACHE®, MapR-DB by the MAPR® corporation, or any other suitable database product. Moreover, any database may be organized in any suitable manner, for example, as data tables or lookup tables. Each record may be a single file, a series of files, a linked series of data fields, or any other data structure.

As used herein, big data may refer to partially or fully structured, semi-structured, or unstructured data sets including millions of rows and hundreds of thousands of columns. A big data set may be compiled, for example, from a history of purchase transactions over time, from web registrations, from social media, from records of charge (ROC), from summaries of charges (SOC), from internal data, or from other suitable sources. Big data sets may be compiled without descriptive metadata such as column types, counts, percentiles, or other interpretive-aid data points.

Association of certain data may be accomplished through any desired data association technique such as those known or practiced in the art. For example, the association may be accomplished either manually or automatically. Automatic association techniques may include, for example, a database search, a database merge, GREP, AGREP, SQL, using a key field in the tables to speed searches, sequential searches through all the tables and files, sorting records in the file according to a known order to simplify lookup, and/or the like. The association step may be accomplished by a database merge function, for example, using a "key field" in pre-selected databases or data sectors. Various database tuning steps are contemplated to optimize database performance. For example, frequently used files such as indexes may be placed on separate file systems to reduce In/Out ("I/O") bottlenecks.

More particularly, a "key field" partitions the database according to the high-level class of objects defined by the key field. For example, certain types of data may be designated as a key field in a plurality of related data tables and the data tables may then be linked on the basis of the type of data in the key field. The data corresponding to the key field in each of the linked data tables is preferably the same or of the same type. However, data tables having similar, though not identical, data in the key fields may also be linked by using AGREP, for example. In accordance with one embodiment, any suitable data storage technique may be utilized to store data without a standard format. Data sets may be stored using any suitable technique, including, for example, storing individual files using an ISO/IEC 7816-4 file structure; implementing a domain whereby a dedicated file is selected that exposes one or more elementary files containing one or more data sets; using data sets stored in individual files using a hierarchical filing system; data sets stored as records in a single file (including compression, SQL accessible, hashed via one or more keys, numeric, alphabetical by first tuple, etc.); data stored as Binary Large Object (BLOB); data stored as ungrouped data elements encoded using ISO/IEC 7816-6 data elements; data stored as ungrouped data elements encoded using ISO/IEC Abstract Syntax Notation (ASN.1) as in ISO/IEC 8824 and 8825; other proprietary techniques that may include fractal compression methods, image compression methods, etc.

In various embodiments, the ability to store a wide variety of information in different formats is facilitated by storing the information as a BLOB. Thus, any binary information can be stored in a storage space associated with a data set. As discussed above, the binary information may be stored in association with the system or external to but affiliated with the system. The BLOB method may store data sets as ungrouped data elements formatted as a block of binary via a fixed memory offset using either fixed storage allocation, circular queue techniques, or best practices with respect to memory management (e.g., paged memory, least recently used, etc.). By using BLOB methods, the ability to store various data sets that have different formats facilitates the storage of data, in the database or associated with the system, by multiple and unrelated owners of the data sets. For example, a first data set which may be stored may be provided by a first party, a second data set which may be stored may be provided by an unrelated second party, and yet a third data set which may be stored may be provided by a third party unrelated to the first and second party. Each of these three exemplary data sets may contain different information that is stored using different data storage formats and/or techniques. Further, each data set may contain subsets of data that also may be distinct from other subsets.

As stated above, in various embodiments, the data can be stored without regard to a common format. However, the data set (e.g., BLOB) may be annotated in a standard manner when provided for manipulating the data in the database or system. The annotation may comprise a short header, trailer, or other appropriate indicator related to each data set that is configured to convey information useful in managing the various data sets. For example, the annotation may be called a "condition header," "header," "trailer," or "status," herein, and may comprise an indication of the status of the data set or may include an identifier correlated to a specific issuer or owner of the data. In one example, the first three bytes of each data set BLOB may be configured or configurable to indicate the status of that particular data set; e.g., LOADED, INITIALIZED, READY, BLOCKED, REMOVABLE, or DELETED. Subsequent bytes of data may be used to indicate for example, the identity of the issuer, user, transaction/membership account identifier or the like. Each of these condition annotations are further discussed herein.

The data set annotation may also be used for other types of status information as well as various other purposes. For example, the data set annotation may include security information establishing access levels. The access levels may, for example, be configured to permit only certain individuals, levels of employees, companies, or other entities to access data sets, or to permit access to specific data sets based on the transaction, merchant, issuer, user, or the like. Furthermore, the security information may restrict/permit only certain actions, such as accessing, modifying, and/or deleting data sets. In one example, the data set annotation indicates that only the data set owner or the user are permitted to delete a data set, various identified users may be permitted to access the data set for reading, and others are altogether excluded from accessing the data set. However, other access restriction parameters may also be used allowing various entities to access a data set with various permission levels as appropriate.

The data, including the header or trailer, may be received by a standalone interaction device configured to add, delete, modify, or augment the data in accordance with the header or trailer. As such, in one embodiment, the header or trailer is not stored on the transaction device along with the associated issuer-owned data, but instead the appropriate action may be taken by providing to the user, at the standalone device, the appropriate option for the action to be taken. The system may contemplate a data storage arrangement wherein the header or trailer, or header or trailer history, of the data is stored on the system, device or transaction instrument in relation to the appropriate data.

One skilled in the art will also appreciate that, for security reasons, any databases, systems, devices, servers, or other components of the system may consist of any combination thereof at a single location or at multiple locations, wherein each database or system includes any of various suitable security features, such as firewalls, access codes, encryption, decryption, compression, decompression, and/or the like.

Practitioners will also appreciate that there are a number of methods for displaying data within a browser-based document. Data may be represented as standard text or within a fixed list, scrollable list, drop-down list, editable text field, fixed text field, pop-up window, and the like. Likewise, there are a number of methods available for modifying data in a web page such as, for example, free text entry using a keyboard, selection of menu items, check boxes, option boxes, and the like.

The data may be big data that is processed by a distributed computing cluster. The distributed computing cluster may be, for example, a HADOOP® software cluster configured to process and store big data sets with some of nodes comprising a distributed storage system and some of nodes comprising a distributed processing system. In that regard, distributed computing cluster may be configured to support a HADOOP® software distributed file system (HDFS) as specified by the Apache Software Foundation at www.hadoop.apache.org/docs.

As used herein, the term "network" includes any cloud, cloud computing system, or electronic communications system or method which incorporates hardware and/or software components. Communication among the parties may be accomplished through any suitable communication channels, such as, for example, a telephone network, an extranet, an intranet, internet, point of interaction device (point of sale device, personal digital assistant (e.g., an IPHONE® device, a BLACKBERRY® device), cellular phone, kiosk, etc.), online communications, satellite communications, off-line communications, wireless communications, transponder communications, local area network (LAN), wide area network (WAN), virtual private network (VPN), networked or linked devices, keyboard, mouse, and/or any suitable communication or data input modality. Moreover, although the system is frequently described herein as being implemented with TCP/IP communications protocols, the system may also be implemented using IPX, APPLETALK® program, IP-6, NetBIOS, OSI, any tunneling protocol (e.g. IPsec, SSH, etc.), or any number of existing or future protocols. If the network is in the nature of a public network, such as the internet, it may be advantageous to presume the network to be insecure and open to eavesdroppers. Specific information related to the protocols, standards, and application software utilized in connection with the internet is generally known to those skilled in the art and, as such, need not be detailed herein.

"Cloud" or "Cloud computing" includes a model for enabling convenient, on-demand network access to a shared pool of configurable computing resources (e.g., networks, servers, storage, applications, and services) that can be rapidly provisioned and released with minimal management effort or service provider interaction. Cloud computing may include location-independent computing, whereby shared servers provide resources, software, and data to computers and other devices on demand.

As used herein, "transmit" may include sending electronic data from one system component to another over a network connection. Additionally, as used herein, "data" may include encompassing information such as commands, queries, files, data for storage, and the like in digital or any other form.

Any database discussed herein may comprise a distributed ledger maintained by a plurality of computing devices (e.g., nodes) over a peer-to-peer network. Each computing device maintains a copy and/or partial copy of the distributed ledger and communicates with one or more other computing devices in the network to validate and write data to the distributed ledger. The distributed ledger may use features and functionality of blockchain technology, including, for example, consensus-based validation, immutability, and cryptographically chained blocks of data. The blockchain may comprise a ledger of interconnected blocks containing data. The blockchain may provide enhanced security because each block may hold individual transactions and the results of any blockchain executables. Each block may link to the previous block and may include a timestamp. Blocks may be linked because each block may include the hash of the prior block in the blockchain. The linked blocks form a chain, with only one successor block allowed to link to one other predecessor block for a single chain. Forks may be possible where divergent chains are established from a previously uniform blockchain, though typically only one of the divergent chains will be maintained as the consensus chain. In various embodiments, the blockchain may implement smart contracts that enforce data workflows in a decentralized manner. The system may also include applications deployed on user devices such as, for example, computers, tablets, smartphones, Internet of Things devices ("IoT" devices), etc. The applications may communicate with the blockchain (e.g., directly or via a blockchain node) to transmit and retrieve data. In various embodiments, a governing organization or consortium may control access to data stored on the blockchain. Registration with the managing organization(s) may enable participation in the blockchain network.

Data transfers performed through the blockchain-based system may propagate to the connected peers within the blockchain network within a duration that may be determined by the block creation time of the specific blockchain technology implemented. For example, on an ETHEREUM®-based network, a new data entry may become available within about 13-20 seconds as of the writing. On a HYPERLEDGER® Fabric 1.0 based platform, the duration is driven by the specific consensus algorithm that is chosen, and may be performed within seconds. In that respect, propagation times in the system may be improved compared to existing systems, and implementation costs and time to market may also be drastically reduced. The system also offers increased security at least partially due to the immutable nature of data that is stored in the blockchain, reducing the probability of tampering with various data inputs and outputs. Moreover, the system may also offer increased security of data by performing cryptographic processes on the data prior to storing the data on the blockchain. Therefore, by transmitting, storing, and accessing data using the system described herein, the security of the data is improved, which decreases the risk of the computer or network from being compromised.

In various embodiments, the system may also reduce database synchronization errors by providing a common data structure, thus at least partially improving the integrity of stored data. The system also offers increased reliability and fault tolerance over traditional databases (e.g., relational databases, distributed databases, etc.) as each node operates with a full copy of the stored data, thus at least partially reducing downtime due to localized network outages and hardware failures. The system may also increase the reliability of data transfers in a network environment having reliable and unreliable peers, as each node broadcasts messages to all connected peers, and, as each block comprises a link to a previous block, a node may quickly detect a missing block and propagate a request for the missing block to the other nodes in the blockchain network.

The particular blockchain implementation described herein provides improvements over conventional technology by using a decentralized database and improved processing environments. In particular, the blockchain implementation improves computer performance by, for example, leveraging decentralized resources (e.g., lower latency). The distributed computational resources improves computer performance by, for example, reducing processing times. Furthermore, the distributed computational resources improves computer performance by improving security using, for example, cryptographic protocols.

The invention claimed is:

1. A system comprising:
   a processor;
   a keypad in communication with the processor and configured for controlling a window shade at a window; and
   a learning button configured to, in response to the learning button being activated by a user, instruct the processor to start to acquire data about environmental conditions and building conditions that exist only at a task area of the user,
   wherein the task area consists of a desktop area and a computer screen thereon configured for the user,
   wherein an override mode overrides an automation routine, wherein the override mode is initiated by an override request using an override button that is different from the learning button, wherein the processor is further configured to reject the override request for the override mode, if the override mode causes increased electricity usage, wherein the processor adjusts the automation routine based on the environmental conditions and the building conditions only at the task area, wherein the processor is further configured to reject the override request, if the override mode violates eco-friendly operations, wherein the processor is further configured to optimize only the task area by determining an amount of desired light only at the task area based on monitoring impacts only at the task area by occupancy, exterior light at the window, interior room lighting, interior temperature, exterior temperature, weather, and computer screen brightness, and wherein the processor is configured to implement the amount of desired light only at the task area by using artificial intelligence to determine how to adjust the window shade and a lighting system to adjust daylight and artificial light that impact only the task area.

2. The system of claim 1, wherein the processor is configured to send a signal to a window shade motor to jog the window shade up and down, in response to an adjustment implemented by the keypad.

3. The system of claim 2, wherein a light bar and a backlight changes color, in response to the automation routine being active.

4. The system of claim 3, further comprising an eco-friendly button configured to implement an eco-friendly operating mode by positioning the window shade in a position to provide the eco-friendly operations, wherein the eco-friendly operations comprise reducing building energy consumption, reducing carbon footprint, reducing energy consumption by the window shade, reducing energy consumption by other building systems and restricting light pollution for LEED credits.

5. The system of claim 4, wherein the learning button includes visual feedback by changing levels of the backlight and flashing the backlight.

6. The system of claim 5, wherein the keypad interfaces with a Power of Ethernet (POE) network.

7. The system of claim 6, further comprising the light bar on a side of the keypad having a lighted portion that visually represents a position of the window shade, wherein a length of the lighted portion represents a length the window shade is unrolled over a window, and wherein a speed of a light going down the light bar represents a speed of movement of the window shade.

8. The system of claim 7, wherein the environmental conditions include occupancy, exterior light at the window, interior room lighting, interior temperature, exterior temperature, weather, and computer screen brightness.

9. The system of claim 8, wherein the building conditions include a condition of window shades, lighting system, building management system and air conditioning system.

10. The system of claim 9, further comprising beacon tracking configured for tracking people in a room that includes the keypad and a proximity sensor configured for enabling a feature on the keypad, in response to the user being in a predetermined proximity to the keypad.

11. The system of claim 10, wherein the processor adjusts the automation routine such that the system performs an action comprising a window shade movement, adjusting a motor, adjusting a light, adjusting speed of the window shade, adjusting acceleration of the window shade, adjusting air conditioning and instructing a building management system.

12. The system of claim 11, wherein the processor is further configured to acquire information about the user associated with the override request and the override mode.

13. The system of claim 12, wherein the processor is further configured to transmit queries to obtain more information from the user about the override request and the override mode.

14. The system of claim 13, wherein the processor is further configured to track time and conditions associated with the override mode.

15. The system of claim 14, further comprising buttons on the keypad configured to perform different functions related to the controlling of the window shade, wherein a first of the buttons is pre-set to cause the window shade to be positioned directly to 25% open, a second of the buttons is pre-set to cause the window shade to be positioned directly to 50% open, and a third of the buttons is pre-set to cause the window shade to be positioned directly to 75% open.

\* \* \* \* \*